(12) United States Patent
Smith et al.

(10) Patent No.: US 7,479,604 B1
(45) Date of Patent: Jan. 20, 2009

(54) FLEXIBLE APPLIANCE AND RELATED METHOD FOR ORTHOGONAL, NON-PLANAR INTERCONNECTIONS

(75) Inventors: Brian Smith, Melbourne, FL (US); Hector Deju, Indialantic, FL (US); Scott Burri, Cocoa, FL (US); Larry E. Crider, Melbourne, FL (US); Joseph Kreuzpaintner, Orlando, FL (US); Gregory M. Jandzio, Melbourne, FL (US); Walter M. Whybrew, Grant, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 11/862,760

(22) Filed: Sep. 27, 2007

(51) Int. Cl.
*H05K 1/16* (2006.01)
(52) U.S. Cl. .................. 174/260; 174/262; 361/761
(58) Field of Classification Search ............ 439/68, 439/507; 361/760, 761, 767, 773, 776, 777; 174/260–264, 266
See application file for complete search history.

(56) References Cited

U.S. PATENT DOCUMENTS

| | | | |
|---|---|---|---|
| 3,480,836 A * | 11/1969 | Aronstein | 361/720 |
| 3,995,277 A | 11/1976 | Olyphant, Jr. | |
| 4,064,622 A * | 12/1977 | Morris et al. | 29/846 |
| 4,173,019 A | 10/1979 | Williams | |
| 4,644,366 A | 2/1987 | Scholz | |
| 4,689,866 A * | 9/1987 | Cartwright | 29/426.6 |
| 4,793,814 A | 12/1988 | Zifcak et al. | |
| 4,869,671 A * | 9/1989 | Pressley et al. | 439/55 |
| 5,014,159 A * | 5/1991 | Butt | 361/717 |
| 5,994,648 A * | 11/1999 | Glovatsky et al. | 174/260 |
| 6,028,365 A * | 2/2000 | Akram et al. | 257/778 |
| 6,309,575 B1 * | 10/2001 | Boutin et al. | 264/161 |
| 6,417,813 B1 | 7/2002 | Durham | |
| 6,763,579 B2 * | 7/2004 | Haba et al. | 29/842 |
| 6,822,616 B2 | 11/2004 | Durham et al. | |
| 6,835,898 B2 | 12/2004 | Eldridge et al. | |
| 7,106,507 B2 * | 9/2006 | Lee et al. | 359/486 |

* cited by examiner

*Primary Examiner*—Thanh-Tam T Le
(74) *Attorney, Agent, or Firm*—Darby & Darby PC; Robert J. Sacco

(57) ABSTRACT

At least one flexible appliance (120) and related method (300) for orthogonal, non-planar interconnections of at least a first electronic interface (115) disposed on a substrate (110) to an associated second electronic interface (161) positioned beneath the substrate (110). The flexible appliance (120) is comprised of a planar body (121) having at least one electrical connector (122) extending from and orthogonally oriented relative to the planar body (121). In one aspect of the invention, the electrical connector (122) is four electrical connectors (122). There is at least one aperture (112) formed in the substrate (110) for allowing the first electronic interface (115) to be electrically interconnected to the associated second electronic interface (161). The flexible appliance (120) is positioned on the substrate (110) by automated means. Contacts pads (123, 124) on the resilient connector (122) are electrically connected to the second electronic interface (161) and the first electronic interface (115) by automated means such as soldering, thermo sonic bonding, or gap welding.

21 Claims, 6 Drawing Sheets

FLEXIBLE APPLIANCE AND RELATED METHOD FOR ORTHOGONAL, NON-PLANAR INTERCONNECTIONS

BACKGROUND OF THE INVENTION

1. Statement of the Technical Field

The invention relates to interconnecting electronic interfaces. More particularly, the invention relates to a flexible appliance and related method for orthogonal, non planar interconnections of at least one first electronic interface disposed on a substrate to an associated second electronic interface positioned beneath the substrate. The flexible appliance and related method compensates for variances in height between the first and second electronic interfaces as well as offsets in the horizontal directions.

2. Background of the Invention

It is known in the art to effect a plurality of electrical connections between interfaces such as a first electronic component and a second electronic component. In such applications, such electrical connections involve manually connecting individual interfaces. In a lower level of assembly, interconnects such as individual wires or ribbons are manually formed, and attached to the first interface. At the next level of assembly, interconnects are clipped and connected to the second interface. In the manufacture of a device having multiple interfaces requiring an individual electrical connection therebetween, this process is extremely time consuming and can only be performed manually.

There have been attempts to improve one or more features related to the foregoing electrical connections between electronic interfaces. For example, in U.S. Pat. No. 4,793,814 to Zifcak et al. there is provided an improved connector arrangement disposed between first and second electrical circuit boards. The connector arrangement improves consistency of contact stresses between repeated connector compression/decompression cycles, minimizes deformation of the connector element, simplifies design, provides greater predictability with regard to the effect of temperature and time on performance, and contact pad wiping during compression. The connector arrangement includes an electrically nonconductive support member adapted to be disposed between the circuit boards comprising resilient elastomeric foam material and being compressed when the circuit boards are urged together. A multiplicity of interconnect elements are disposed in the support member, and positioned selectively in the plane of the connector array, with the element body extending through the support member to expose contact pad engagement surfaces adjacent connector array surfaces.

Another example of a known connector arrangement is disclosed in U.S. Pat. No. 6,835,898 to Eldridge et al. In particular, that reference discloses contact structures exhibiting resilience or compliance for a variety of electronic components. The contact structures are formed by bonding a free end of a wire to a substrate, configuring the wire into a wire stem having a springable shape, severing the wire stem, and overcoating the wire stem with at least one layer of a material chosen primarily for its structural (resiliency, compliance) characteristics.

One device known to require interconnecting of multiple first electronic interfaces to associated second electronic interfaces is a sheet antenna array. A sheet antenna array is a phased array communication antenna having wide application in satellite communication, remote broadcasting, or military communication. A sheet array antenna has desirable characteristics including being low cost, light-weight, having a low profile, and mass producibility. A sheet array antenna is typically comprised of multiple planar conductive elements spaced from a single essentially continuous ground element by a dielectric sheet of uniform thickness. Each of the planar conductive elements is interconnected to an associated interface fed in from another location off the sheet. A wire or ribbon is attached to the associated interface, clipped, and connected to the planar conductive element. The wire or ribbon is connected to the first interface and the second interface using a method such as soldering.

In the manufacture of a device having multiple interfaces requiring an individual electrical connection therebetween, this process can be extremely time consuming and doesn't lend itself well to being automated for several reasons. Particularly, it is too difficult and expensive to convert existing automated machinery to perform the multiple steps required to connect the wire or ribbon from the first interface to the second interface when the size of the device exceeds typical working dimensions. In addition, the machinery required for automating the connection of the wire or ribbon to the first interface, clipping the wire, and then connecting the wire to the planar conductive element could put too much pressure on the substrate and the dielectric sheet. The materials comprising the substrate and the dielectric sheet are often compliant and are not strong enough to support the pressure of the machinery. In addition, due to the compliant nature of the dielectric sheet and/or the substrate, the physical distance between these items often varies between interfaces. This is especially problematic considering that the dielectric sheet could be comprised of a foam material.

Further, conventional methods of making the final connection of the wire or ribbons to the first and second interfaces such as automated mass reflow soldering often require preheating the first and second interfaces to a high temperature. This necessarily requires the substrate, the dielectric sheet, and any electronic components disposed on the substrate to also be heated to a high temperature. This is especially undesirable since the substrate, dielectric sheet, or electronic components disposed on the substrate could be damaged by the high temperature.

For example, the planar conductive elements can be antenna dipole elements and the interfaces can be antenna feeds from a source disposed beneath the sheet antenna array. Consequently, the antenna feeds must pass through a hole in the sheet and be individually interconnected to the antenna dipole elements. In a sheet antenna array, there could be four antenna feeds that are fed from a source disposed underneath the sheet array. The antenna feeds could pass through a hole in the sheet array and must be individually interconnected to the associated dipole antenna element. Considering that a sheet antenna array can have numerous arrangements of antenna dipole elements and feeds arranged over the expanse of the sheet, the process of individually interconnecting the antenna feeds to the antenna dipole elements is both labor and time intensive. This is generally considered unsatisfactory.

In view of the foregoing, there remains a need for interconnecting at least one or multiple first electronic interfaces disposed on a substrate to an associated second electronic interface positioned beneath the substrate that can be automated to avoid the time and labor intensive process and other disadvantages of the prior art.

SUMMARY OF THE INVENTION

In one aspect of the invention, the invention relates to an electronic interconnection of at least one first electronic interface disposed on a substrate to an associated second electronic interface positioned beneath the substrate. There is at least one aperture formed in the substrate associated with the first electronic interface. There is at least one flexible appliance comprising a planar body positioned on the substrate associated with the aperture. The flexible appliance includes at least one electrically conductive resilient connector extending from and orthogonally oriented relative to the planar body. The resilient connector interconnects the first electronic interface and the second electronic interface through the aperture. The resilient connector is comprised of an electrically conductive material including copper, gold, silver or nickel-plated gold. The planar body is comprised of a flexible polymer film providing a base for supporting the resilient connector. The planar body is grasped for positioning the flexible appliance on the substrate by manual or automated means.

The first electronic interface is etched on the substrate. The first electronic interface is comprised of copper, silver or gold material. In one aspect of the invention, the first electronic interface is an electrically conductive contact pad for interconnection to a circuit or an electronic component disposed on the substrate. The second electronic interface is a circuit or electronic component not disposed on the substrate. In one aspect of the invention, the second electronic interface is disposed on an orthogonal element positioned beneath the substrate and abutting the aperture. In another aspect of the invention, the first electronic interface is four first electronic interfaces comprising antenna dipole elements of a sheet array antenna. The second electronic interfaces are antenna feeds that are commonly fed through the aperture.

The resilient connector includes a first contact portion disposed adjacent to a first end of the resilient connector. The first contact portion is positioned on the first electronic interface when the flexible appliance is positioned on the substrate. There is a second contact portion disposed adjacent to a second end of the resilient connector. The second contact portion is positioned on the second electronic interface when the flexible appliance is positioned on the substrate. The resilient connector may be coated with a polymer material for insulating the resilient connector. If present, the resilient connector has portions that are uncoated or where the polymer material has been removed forming the first and second contact portions.

In another aspect of the invention, the first electronic interface is four first electronic interfaces each having associated second electronic interfaces positioned beneath the substrate. The resilient connector is four resilient connectors each extending radially from the planar body and orthogonally oriented relative to the planar body. Each of the resilient connectors interconnects one of the first electronic interfaces to the associated second electronic interfaces. There is an electrically conductive connection means electrically connecting the first contact portions of the first electronic interfaces and the second contact portions to the second electronic interfaces. The electrically conductive means includes automated means such as conductive polymers or adhesives, soldering, thermo sonic bonding, gap welding, or other focused energy contact or non-contact methods. Using the automated means, the first contact portions are connected to the first electronic interfaces and the second contact portions are connected to the second electronic interfaces at or near the same time.

In another aspect of the invention, the aperture is multiple apertures formed uniformly or non-uniformly spaced in the substrate. The first electronic interface is four electronic interfaces associated with each of the apertures. Each of the four first electronic interfaces has one associated second electronic interface disposed beneath the substrate. There is one flexible appliance including a planar body associated with each of the apertures. Each of the flexible appliances has four resilient electronic connectors extending radially from and orthogonally oriented relative to the planar body. The resilient connectors interconnect the four first electronic interfaces to the associated second electronic interfaces. An electrically conductive connection means electrically connects the first contact portions of the first electronic interfaces and the second contact portions to the second electronic interfaces. Using the automated means, the first contact portions are connected to the first electronic interfaces and the second contact portions are connected to the second electronic interfaces at the same time.

In another aspect of the invention, the invention relates to a method of interconnecting at least one first electronic interface disposed on a substrate to an associated second electronic interface positioned beneath the substrate. The method includes forming at least one first electronic interface on the substrate.

The method further includes forming an aperture in the substrate associated with the first electronic interface. In one aspect of the invention, the method includes selecting the first electronic interface to be four first electronic interfaces formed on the substrate. This step can involve forming multiple apertures in the substrate with at least one first electronic interface associated with each aperture. In one aspect of the invention, there could be four first electronic interfaces formed in the substrate associated with each aperture.

In another step in the method, a second electronic interface associated with the first electronic interface is positioned beneath the substrate. The first electronic interface is accessible through the aperture for electrically interconnecting to the first electronic interface.

The method continues with the step of forming a flexible appliance having a planar body and at least one resilient connector extending radially from and orthogonally oriented relative to the planar body. This step includes forming the resilient connector with a first contact portion and second contact portion. The forming step bends the resilient connector into a gull wing configuration, allowing the interconnection of non-planar electronic interfaces. In one aspect of the method, there are four resilient connectors extending radially from and orthogonally oriented relative to the planar body.

In another step of the method, the flexible appliance is positioned on the substrate. This step involves positioning the first contact portion on the first electronic interface and positioning the second contact portion on the second electronic interface.

In another step in the method, an electrically conductive connection means is used to electrically connect the first contact portion to the first electronic interface and the second contact portion to the second electronic interface. The step further involves selecting the electrically conductive connection means to be automated means including soldering, thermo sonic bonding or gap welding.

BRIEF DESCRIPTION OF THE DRAWINGS

Embodiments will be described with reference to the following drawing figures, in which like numerals represent like items throughout the figures, and in which.

DETAILED DESCRIPTION OF THE PREFERRED EMBODIMENTS

Figure 1:
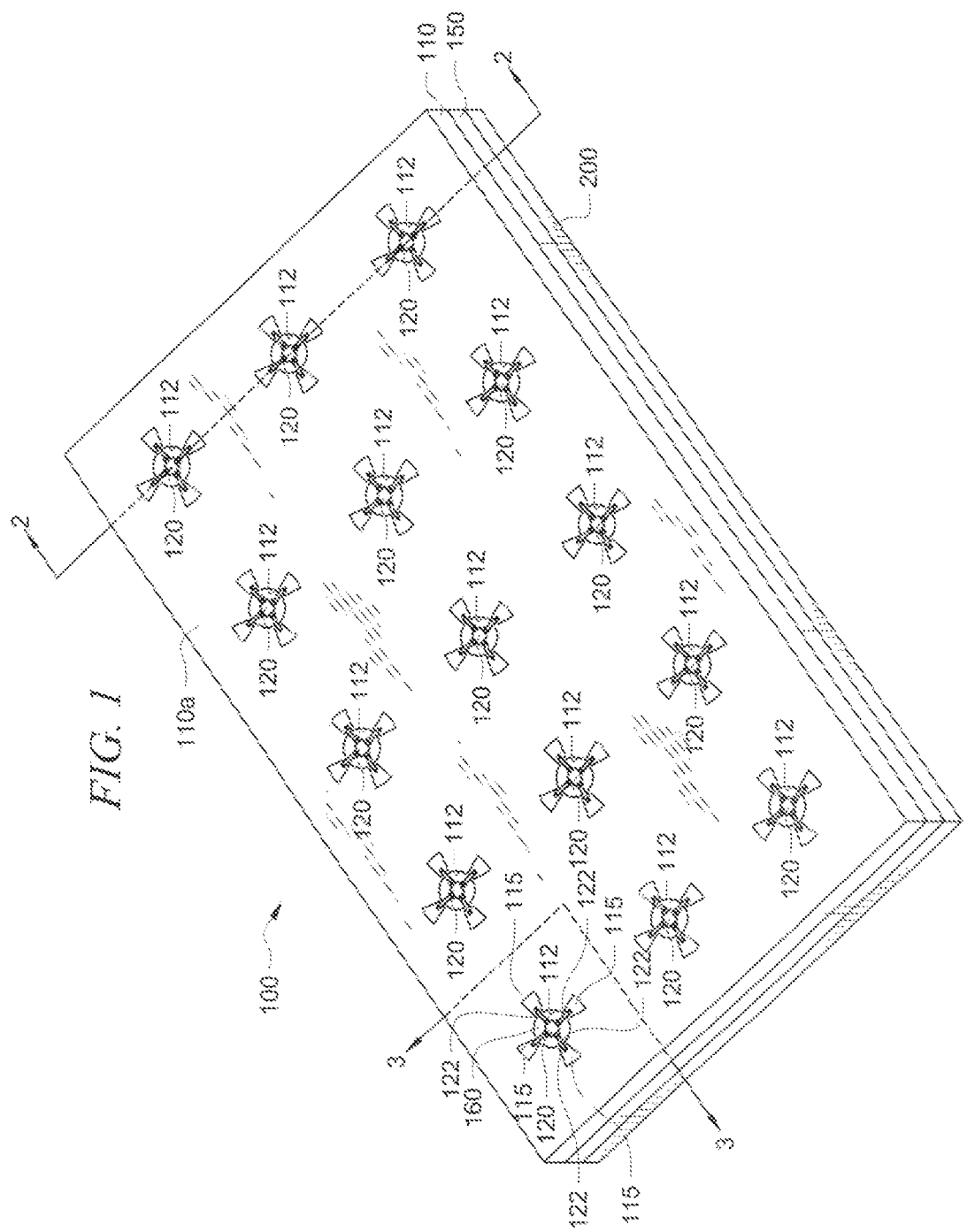
FIG. 1 is a perspective view of a composite sheet comprising multiple flexible appliances for orthogonal, non-planar interconnections of multiple first electronic interfaces disposed on a substrate to associated multiple second interfaces disposed beneath the substrate.
Figure 2:
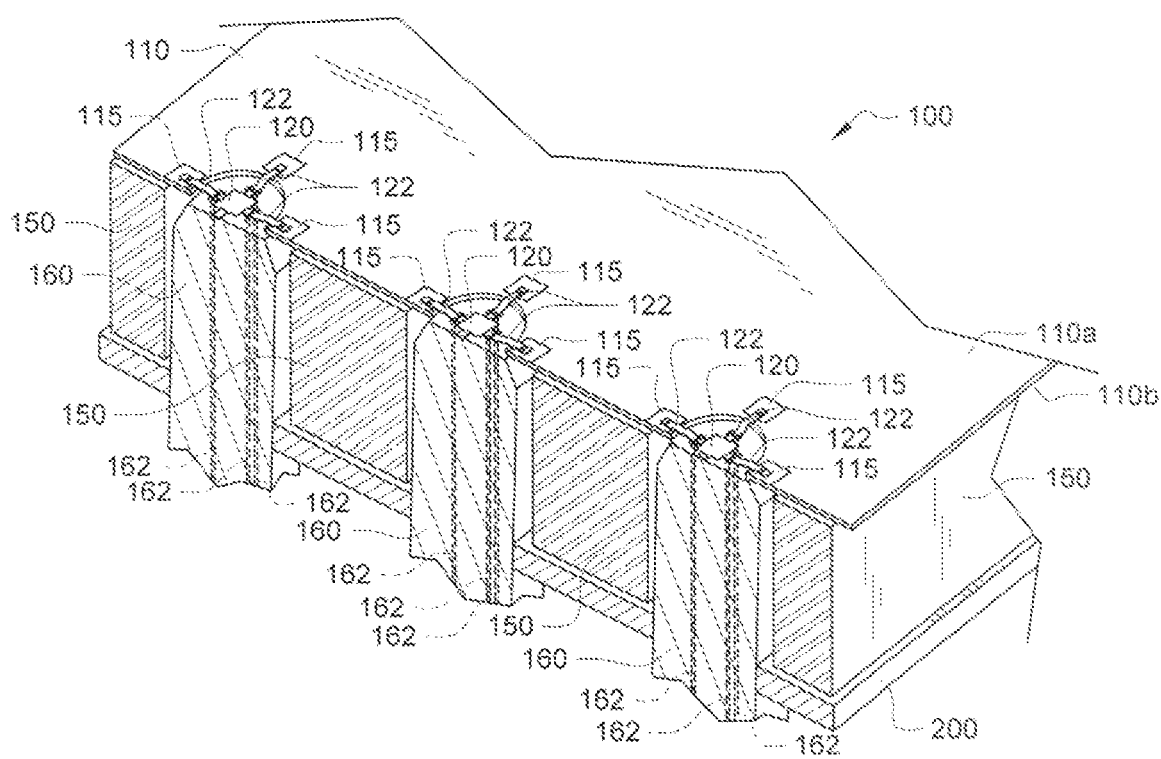
FIG. 2 is a perspective cross-sectional view of the composite sheet of FIG. 1 taken along line 2-2 of FIG. 1.

Referring now to FIGS. 1-2, shown are perspective and cross-sectional perspective views of a composite sheet 100 containing at least one first electronic interface 115 disposed on a substrate 110. The substrate 110 is comprised of a material having desirable mechanical and electrical properties. The desired mechanical properties of the substrate 110 include rigidity, hardness, melting temperature and thermal coefficient of expansion. The desirable electrical properties include a desirable dielectric constant. It should be understood that it is desirable that the dielectric constant of the substrate 110 be low and close to one (1).

The first electronic interface 115 is electrically interconnected to an associated second electronic interface 161 (best seen in FIGS. 3-5) disposed beneath the substrate 110. The composite sheet 100 is formed from the substrate 110 and at least one additional layer 150 disposed beneath the substrate 110. The additional layer 150 is a second or an intermediate layer 150. There is a third layer 200 disposed beneath the second layer 150. The third layer 200 is a sheet including a conductive sheet such as a ground plane as is known to one of ordinary skill in the art. The second layer 150 could be comprised of a layer of foam serving as a backing layer and spacer between the substrate 110 and the third layer 200. However, the invention is not limited in this regard as there could by other arrangements of a composite sheet 100 with additional substrate layers, intermediate layers comprised of materials such as foam, and/or additional layers of electrically conducting material including ground plane layers. The substrate 110, second layer 150 and third layer 200 are sandwiched together to form the composite sheet 100.

Figure 3:
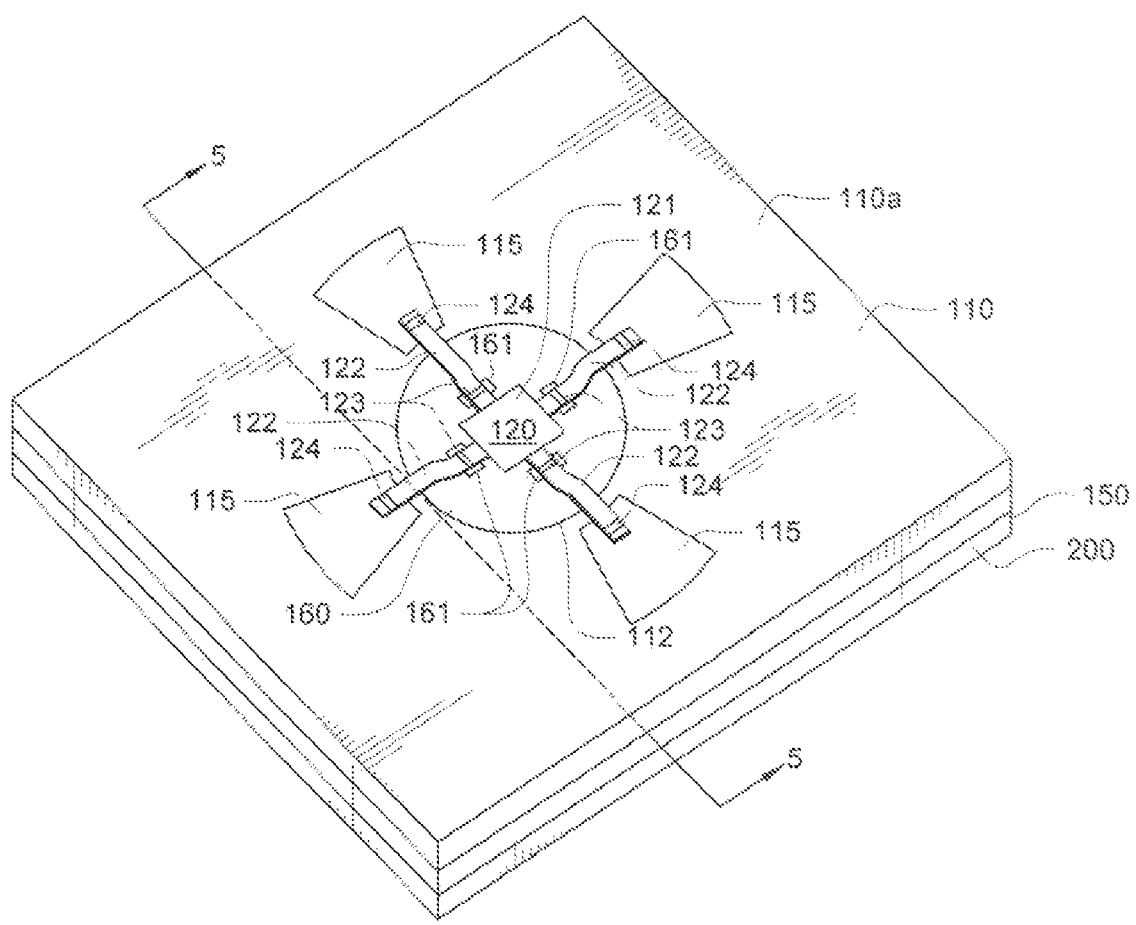
FIG. 3 is a perspective view of an exemplary section of the composite sheet of FIG. 1 taken along line 3-3 of FIG. 1 illustrating the use of a single flexible appliance for orthogonal, non-planar interconnections of multiple first electronic interfaces disposed on the substrate to associated second electronic interfaces disposed beneath the substrate.
Figure 4:
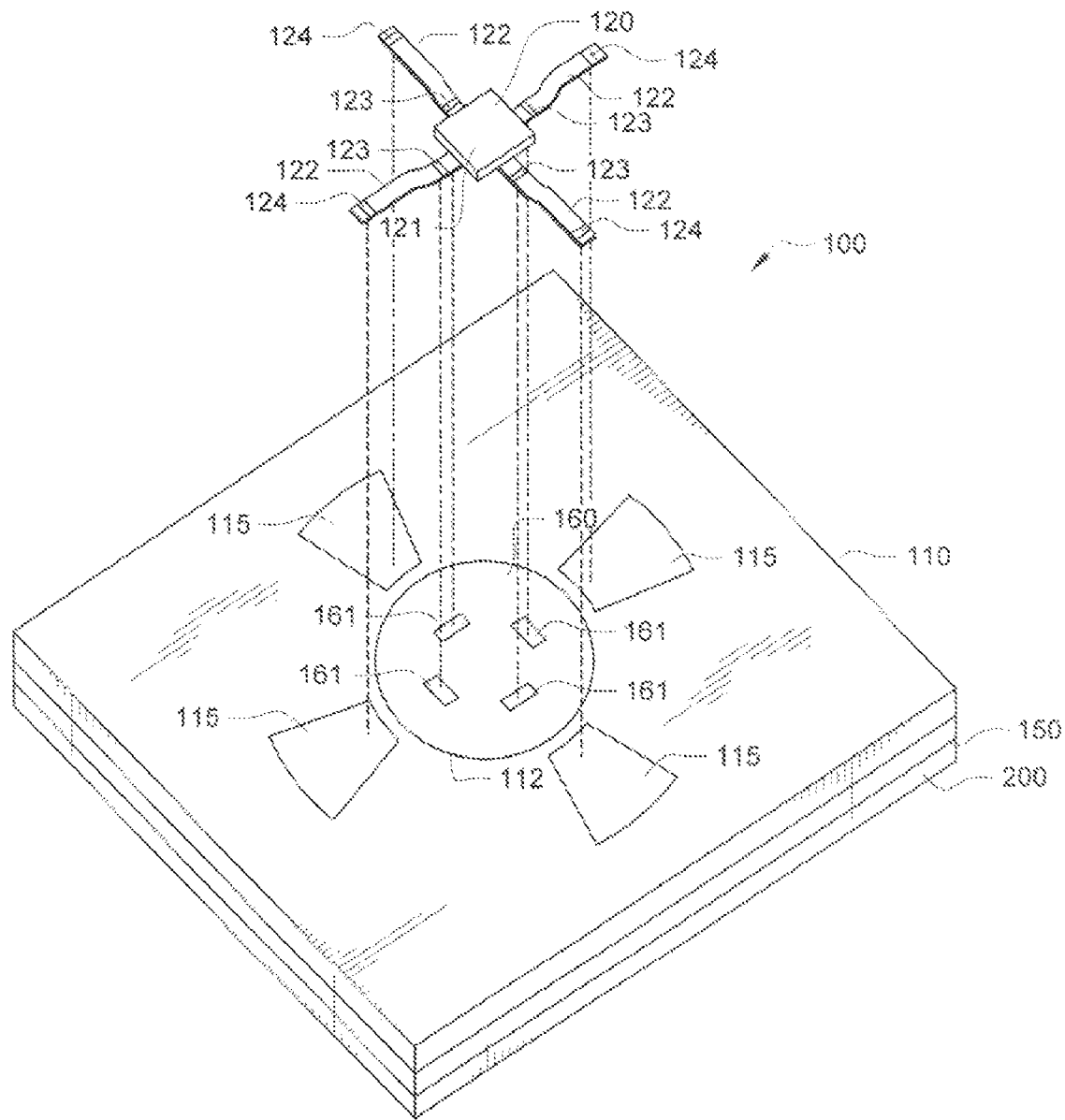
FIG. 4 is a partially exploded view of the exemplary section of the composite sheet of FIG. 3 illustrating the positioning of the flexible appliance on the substrate for interconnecting multiple first electronic interfaces disposed on the substrate to associated second electronic interfaces disposed beneath the substrate.
Figure 5:
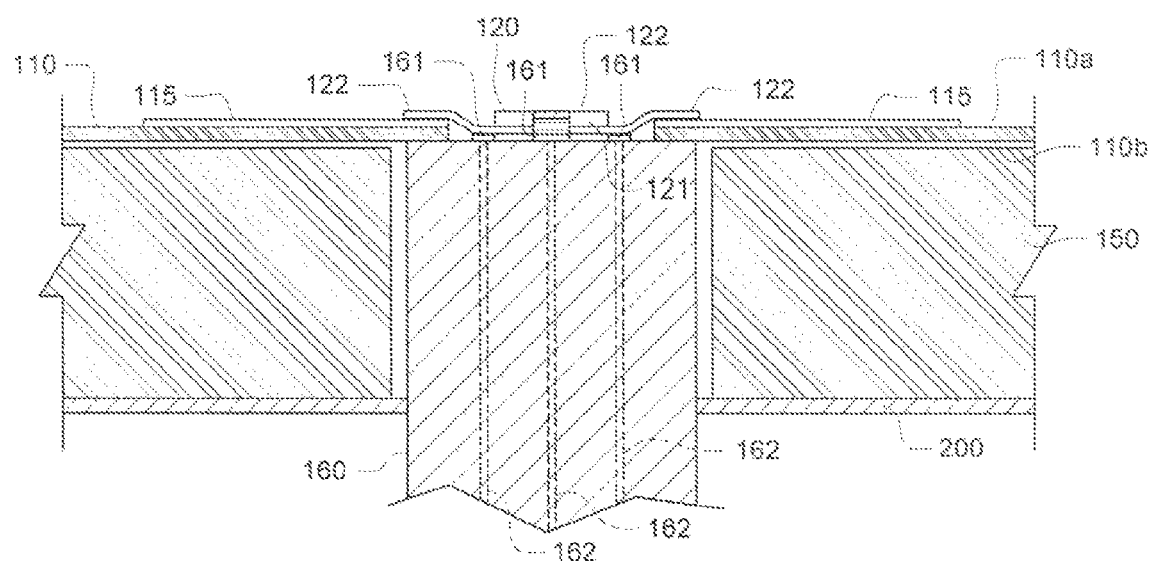
FIG. 5 is a cross-sectional view of the exemplary section of the composite sheet of FIG. 3 taken along line 5-5 of FIG. 3 illustrating the use of the flexible appliance for interconnecting first electronic interfaces disposed on the substrate to associated second electronic interfaces disposed beneath the substrate.

In one aspect of the invention, the first electronic interface 115 is electrically interconnected to the second electronic interface 161 (FIGS. 3-5) with a flexible appliance 120. The flexible appliance 120 includes at least one connecting element 122 (best seen in FIGS. 3-5) for electrically interconnecting the first electronic interface 115 to the second electronic interface 161 (FIGS. 3-5). There is at least one aperture 112 in the substrate 110. The aperture 112 is for allowing the connecting element 122 to pass through the substrate 110 to interconnect the first electronic interface 115 to the second electronic interface 161 (FIGS. 3-5). The second electronic interface 161 is disposed on a vertical or orthogonal element 160 that abuts the aperture 112 on a lower surface 110b of the substrate 110. However, the invention is not limited in this regard as the second electronic interface 161 could be disposed on another element known to one of ordinary skill in the art.

In another aspect of the invention, the flexible appliance 120 includes four connecting elements 122. The connecting elements 122 extend radially outward from a carrier or planar body 121 (best seen in FIG. 4). The connecting elements 122 are arranged orthogonally relative to the planar body 121. The planar body 121 is discussed in detail below. Each of the connecting elements 122 electrically interconnects a first electronic interface 115 disposed on an upper surface 110a of the substrate 110 to an associated second electronic interface 161 (FIGS. 3-5). The associated second electronic interface 161 (FIGS. 3-5) is disposed on the orthogonal element 160 disposed beneath the substrate 110. Thus, the flexible appliance 120 is used to electrically interconnect four first electronic interfaces 115 to associated second electronic interfaces 161 (FIGS. 3-5) disposed on the orthogonal element 160. In addition, there could be multiple apertures 112 defined in the substrate 110. The multiple apertures 112 are defined in the substrate 110 and dispersed uniformly or non-uniformly across the length and width of the substrate 110.

The multiple apertures 112 allow at least one or multiple first electronic interfaces 115 disposed on the substrate 110 to be interconnected to associated second electronic interfaces 161 (FIGS. 3-5). The second electronic interfaces 115 are associated orthogonal elements 160 positioned beneath the substrate 110. The orthogonal elements 160 extend from underneath and pass through the third layer 200 and the second layer 150. The orthogonal elements 160 abut the lower surface 110b of the substrate 110 in the proximity of an aperture 112 associated with each orthogonal element 160.

The first electronic interfaces 115 are electrically interconnected to the associated second electronic interfaces 161 with connecting elements 122. The connecting elements 122 extend radially from a planar body 121 comprising a flexible appliance 120 associated with each aperture 112. The connecting elements 122 are arranged orthogonally relative to the planar body 121. In view of the foregoing, it should be appreciated that multiple first electronic interfaces 115 are electrically interconnected to associated multiple second electronic interfaces 161 with the flexible appliance 120. It should also be appreciated that multiple flexible appliances 120 are used to electrically interconnect multiple first electronic interfaces 115 to associated multiple second interfaces 161. Such an arrangement of multiple first interfaces 115 electrically interconnected to associated multiple second interfaces 161 is useful in many applications known to one of ordinary skill in the art.

For example, in one aspect of the invention, the substrate 110 is a printed circuit board known as a printed wiring board (PWB). A PWB is a self-contained module of interconnected electronic components found in electronic devices ranging from radios to sophisticated radar and computer systems. The PWB is used to mechanically support and electrically interconnect electronic components (not shown) using conductive pathways, or traces, etched from copper sheets or other materials laminated onto a non-conductive substrate such as substrate 110.

The conductive pathways or traces etched onto the substrate 110 are the first electronic interfaces 115 discussed above. The first electronic interfaces 115 are conductive pads etched on the substrate 110. The conductive pads are etched from copper, gold, silver or other suitable material known to one of ordinary skill in the art. The conductive pads are used for electrically interconnecting to the electronic components (not shown) disposed on the substrate 110. The electronic components (not shown) interconnected by the first interfaces 115 include resistors, transistors, capacitors, diodes, switches, integrated circuits or any other electronic component known to one of ordinary skill in the art. The PWB may have circuits that perform a single function, such as a signal amplifier, or multiple functions.

The electronic components (not shown) on a printed wiring board could be electrically connected to the first interfaces 115 by using surface mount technology. Surface mounting technology lends itself well to a high degree of automation, reducing labor cost and greatly increasing production rates. The electronic components (not shown) could be placed on the substrate by automated machinery. Stubby J-shaped or L-shaped legs on each electronic component (not shown) are positioned in contact with the first interfaces 115. A solder paste consisting of binders, flux and solder could be applied at the point of contact to hold the electronic components (not shown) in place until the solder is melted, or "reflowed," in an oven to make the final connection. Although surface mount technology requires greater care in the placement of the components (not shown), it eliminates the time-consuming drilling process and the space-consuming connection pads inherent with conventional through hole technology.

Similarly, the use of surface mounting technology lends itself well to automating the placement of the plurality of flexible appliances 120 on the upper surface 110a of the substrate 110. Multiple flexible appliances 120 are placed on the substrate 110 over the associated aperture 112 by automated machinery prior to the final connection of the first electronic interfaces 115 to the second electronic interfaces 161. The use of the flexible appliances 120 lends well to automation since the automated machinery known to one of ordinary skill in the art is less expensive and less difficult to set up to perform the placement of the plurality of flexible appliances on the upper surface 110a of the substrate 110 than it is to set up machinery to connect individual interfaces.

When each flexible appliance 120 is placed, the electrical connectors 122 of each flexible appliance 120 are designed to make electrical contact with the associated second electronic interface 161 disposed on the orthogonal element 160 positioned beneath the substrate 110. The second electronic interfaces 161 disposed on the orthogonal element 160 are accessible through the associated aperture 112 defined in the substrate 110. The final connection of the first electronic interfaces 115 and second electronic interfaces 161 via the electrical connectors 122 is made with automated machinery. The final connection is made by an electrically conductive connection means. The electrically conductive connection means includes automated processes using a localized energy source such as soldering, thermo sonic bonding, or gap welding. The use of a localized energy source for making the final connection avoids having to pre-heat the first electronic interfaces 115, the second electronic interfaces 161, the substrate 110, or the orthogonal element 160 to a high temperature. Thus, the risk of damage to the substrate 110, the orthogonal element 160, or electronic components disposed on the substrate is minimized during the final connection.

The second electronic interfaces 161 are further connected to a first end of the electrical conductors 162 that pass through the orthogonal elements 160. The orthogonal elements 160 are formed from a suitable material having insulating properties. The orthogonal elements 160 insulate the electrical conductors 162 from the second layer 150 and the third layer 200. This is especially desirable if the second layer 150 and/or the third layer 200 are electrically conductive. For example, if the third layer 200 is an electrically conductive ground plane, it must be insulated from the electrical conductors 162. The electrical conductors 162 are further connected on a second end to other electric circuits and/or electrical connections which are desired to be electrically connected to the first electronic interfaces 115.

In another aspect of the invention, the substrate 110 is part of a composite sheet 100 forming a sheet array antenna and the first electronic interfaces 115 are planar conductive elements that are antenna dipole elements. Sheet array antennas comprised of at least a substrate layer and a ground plane are well known and have a wide variety of applications known to one of ordinary skill in the art. The second electronic interfaces 161 are electrically connected to the first end of electrical conductors 162 passing through the orthogonal elements 160. In this aspect of the invention, the electrical conductors 162 could be antenna feed elements that commonly share an associated orthogonal element 160 for electrically connecting to associated antenna dipole elements. The second end of the antenna feed elements or electrical conductors 162 are further electrically connected to an antenna feed (not shown).

Referring now to FIG. 3, shown is an enlarged perspective view of an exemplary section of the composite sheet 100 of FIG. 1. FIG. 4 shows a partially exploded view of the exemplary section of the composite sheet 100 of FIG. 3. In FIG. 3, the flexible appliance 120 is shown in position on the upper surface 110a of substrate 110. The flexible appliance 120 is positioned on the upper surface 110a over the aperture 112 defined in substrate 110. The flexible appliance 120 is positioned such that a first end or free ends of the electrical connectors 122 are rested on the first electronic interfaces 115. The opposite or second ends of the electrical connectors 122 are attached to the planar body 121. A portion of each electrical connector 122 is positioned on the associated second electronic interface 161 disposed on the orthogonal element 160 (best seen in FIG. 4). The second electronic interfaces 161 are accessible through the aperture 112 defined in the substrate 110.

The flexible appliance 120 is comprised of the planar body 121 and at least one electrical connector 122 which extends orthogonally outward from the planar body 121. The planar body 121 serves as a handling feature for grasping the flexible appliance 120. The planar body 121 is comprised of a flexible polymer film of a finite thickness that may be approximately 0.002 inches, which serves as a base or carrier for the electrical connectors 122. However, the invention is not limited in this regard as other suitable materials could be used to form the planar body 121. The electrical connectors 122 are resilient members that could be sized and shaped as flat ribbons comprised of an electrically conductive material. For example, the electrical connectors 122 could be one-hundredth (0.010) inch wide, one-tenth (0.1) inch long, and between one-half (0.5) mil to one and one-half (1.5) mil thick. The electrical connectors 122 could be comprised of a material such as copper, gold, silver, nickel-plated gold or other suitable material known to one of ordinary skill in the art.

The flexible appliances 120 are prefabricated and could be mass produced economically and efficiently by automated means. For example, the flexible appliances 120 could be formed from a sheet of conventional PWB comprised of a first copper layer disposed on and bonded to a polymer film layer, and the polymer film layer being further disposed on and bonded to a second layer. The second layer could be comprised of copper, gold, silver or nickel-plated gold. The first copper layer can be etched away using conventional etching techniques known to one of ordinary skill in the art.

After the first copper layer has been etched away, portions of the second copper layer are masked corresponding to the electrical connectors 122 desired to be formed. The masked portions are disposed around a portion of the polymer film layer corresponding to the planar body 121. The unmasked portions of the second layer are etched away using conventional etching techniques known to one of ordinary skill in the art. The electrical connectors 122 remain after the etching of the unmasked portions of the second layer. The remaining portions of the polymer film layer that do not correspond to the planar body 121 forming each flexible appliance 120 is removed from around each planar body 121. The portions of polymer film layer on the upper surface of the electrical connectors 122 are removed by such means as laser ablation or other means known to one of ordinary skill in the art. The formed flexible appliances 120 can then be punched from the polymer film layer using automated means. Using the foregoing technique, a plurality of the flexible appliances 120 can be formed at the same time from a single sheet of PWB. For example, one-hundred (100) flexible appliances 120 could be formed and punched from a single sheet of PWB.

Portions of the electrical connectors 122 could be coated with a polymer material which functions as a dielectric for insulating the electrical connectors 120. Each of the electrical connectors 122 also have a portion that is uncoated or where polymer material removed near the free end. Each of the electrical connectors 122 also have a portion that is uncoated or where the polymer material has been removed near the opposite end adjacent to where the electrical connector 122 is attached to the planar body 121. These portions of the electrical connector 122 are uncoated on both sides of the electrical connector 122. The uncoated portion of the electrical connector 122 on the end of the electrical connector opposite the free end and adjacent to the planar body 121 is referred to as second contact pad 123. The uncoated portion of the electrical connector 122 on the free end of the electrical connector 122 is referred to as first contact pad 124.

The first electronic interfaces 115 are formed on substrate 110 oversized. The first electronic interfaces 115 are formed oversized so that second contact pads 124 will make contact with the first electronic interfaces 115 despite horizontal offsets in multiple directions in the relative positioning of the flexible appliance 120 relative to the first electronic interfaces 115. The second contact pads 123 of the electrical connectors 122 are positioned on the second electronic interfaces 161 disposed on orthogonal element 160. In addition, the resilient electrical connectors 122 allow for variances in height between the first electronic interfaces 115 disposed on the substrate 110 and the second electronic interfaces 161 disposed on the orthogonal element 160. This is best illustrated in FIG. 5.

Once the flexible appliance 120 is positioned, the first contact pads 124 and second contact pads 123 of electronic connector 122 are electrically connected to first electronic interfaces 115 and second electronic interfaces 161, respectively, by an electrically conductive connection means. The electrically conductive connection means could include automated means such as soldering, thermo sonic bonding, or gap welding. Thus, the use of the flexible appliance 120 provides a flexible interconnection means and method for creating orthogonal, non-planar interconnections of at least one and particularly four interconnections at the same time at the top level assembly, rather than being split into two separate assembly processes as it is known in the prior art. Stated another way, the flexible appliance 120 allows for the automation of multi-level connections of first electronic interfaces 115 to second electronic interfaces 161 in multiple directions at the same time. At the same time, the flexible appliance 120 can be formed to accommodate variances in heights in a multi-level stack of varying materials used to form a composite sheet 100.

Figure 6:
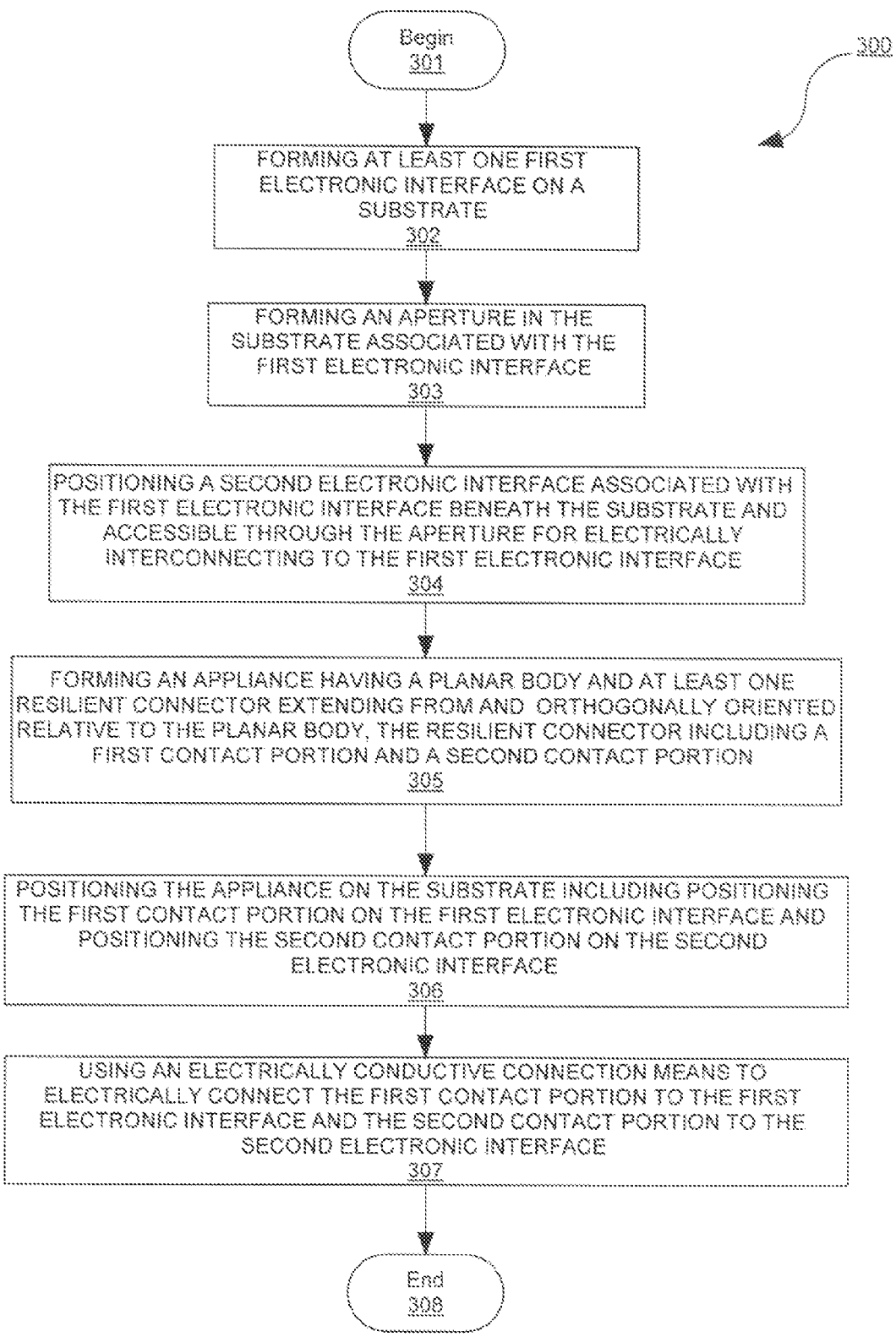
FIG. 6 is a flow diagram of a method of using the flexible appliance for orthogonal, non-planar interconnections of at least one first electronic interface to an associated second electronic interface disposed beneath the substrate.

Referring now to FIG. 6, shown is a flow diagram of a method 300 of interconnecting at least one first electronic interface 115 disposed on a substrate 110 to an associated second electronic interface 161 disposed beneath the substrate 110. As shown in FIG. 6, the method begins with step 301 and continues to step 302. In step 302, at least one first electronic interface 115 is formed on a substrate.

Thereafter, step 303 is performed where an aperture 112 is formed in the substrate 110 associated with the first electronic interface 115. In one aspect of the method, there are four first electronic interfaces 115 formed on the substrate 110 associated with the aperture 112. In another aspect of the method, step 303 involves forming multiple apertures 112 in the substrate 110 with at least one first electronic interface 115 associated with each aperture 112. In another aspect of the method, step 303 involves forming four first electronic interfaces 115 in the substrate 110 associated with each aperture 112.

Subsequent to step 303, the method 300 continues with step 304. In step 304, a second electronic interface 161 associated with the first electronic interface 115 is positioned beneath the substrate 110. The first electronic interface 115 is accessible through the aperture 112 for electrically interconnecting to the first electronic interface 115.

In step 305, an appliance 120 is formed having a planar body 121 and at least one resilient connector 122 extending from and orthogonally oriented relative to the planar body 121. Step 305 includes forming the resilient connector 122 with a first contact portion 124 and second contact portion 123. The forming step bends the resilient connector 122 into a gull wing configuration, allowing the interconnection of non-planar electronic interfaces. In another aspect of the method, the resilient connector 122 is selected to be four resilient connectors 122 extending from and orthogonally oriented relative to the planar body 121.

After step 305, the method 200 continues with step 306. In step 306, the appliance 120 is positioned on the substrate 110. Step 305 includes positioning the first contact portion 124 on the first electronic interface 115 and positioning the second contact portion 123 on the second electronic interface 161.

Subsequent to step 306, step 307 is performed where the method 300 continues. In step 307, an electrically conductive connection means is used to electrically connect the first contact portion 124 to the first electronic interface 115 and the second contact portion 123 to the second electronic interface 161. Step 307 involves selecting the electrically conductive means to be automated means such as soldering, thermo sonic bonding, or gap welding.

After step 307, the method 300 ends with step 308.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

We claim:

1. An electronic interconnection, comprising:
   at least one first electronic interface disposed on a substrate;
   at least one aperture formed through the substrate associated with the first electronic interface;
   a second electronic interface positioned beneath the substrate associated with the first electronic interface, said second electronic interface electrically isolated from said first electronic interface and aligned with said aperture;
   at least one flexible appliance having a planar body positioned on said substrate, said planar body including at least one electrically conductive resilient connector extending from and orthogonally oriented relative to the planar body, said resilient connector electrically interconnecting the first electronic interface and the second electronic interface through said aperture;
   a first contact portion disposed adjacent to a first end of said resilient connector and positioned on said first electronic interface when said planar body is positioned on said substrate;
   a second contact portion disposed adjacent to a second end of said resilient connector and positioned on said second electronic interface when said planar body is positioned on said substrate; and
   an electrically conductive connection means electrically connecting said first contact portion to said first electronic interface and said second contact portion to said second electronic interface.

2. The electronic interconnection of claim 1, wherein said first electronic interface is etched on said substrate.

3. The electronic interconnection of claim 1, wherein said first electronic interface is comprised of copper, gold or silver material.

4. The electronic interface of claim 1, wherein said first electronic interface is an electrically conductive contact pad configured for electrically connecting to a circuit or an electronic component disposed on the substrate.

5. The electronic interface of claim 1, wherein said second electronic interface is a circuit or electronic component disposed on an element beneath said substrate.

6. The electronic interface of claim 1, wherein said second electronic interface is disposed on an orthogonal element disposed beneath said substrate and abutting said aperture.

7. The electronic interface of claim 1, wherein said resilient connector is comprised of an electrically conductive material including copper, gold, silver or nickel-plated gold.

8. The electronic interface of claim 1, wherein a portion of said resilient connector is coated with a polymer material configured for insulating said resilient connector, and portions of said resilient connector are uncoated forming said first and second contact portions.

9. The electronic interface of claim 1, wherein said planar body is comprised of a flexible polymer film configured for supporting said resilient connector and for grasping said planar body when positioning said flexible appliance on said substrate.

10. An electronic interconnection, comprising:
    at least one first electronic interface disposed on a substrate;
    at least one aperture formed in the substrate associated with the first electronic interface;
    a second electronic interface positioned beneath the substrate associated with the first electronic interface;
    at least one flexible appliance having a planar body positioned on said substrate, said planar body including at least one electrically conductive resilient connector extending from and orthogonally oriented relative to the planar body, said resilient connector electrically interconnecting the first electronic interface and the second electronic interface through said aperture;
    a first contact portion disposed adjacent to a first end of said resilient connector and positioned on said first electronic interface when said planar body is positioned on said substrate;
    a second contact portion disposed adjacent to a second end of said resilient connector and positioned on said second electronic interface when said planar body is positioned on said substrate; and
    an electrically conductive connection means electrically connecting said first contact portion to said first electronic interface and said second contact portion to said second electronic interface;
    wherein said first electronic interface comprises four first electronic interfaces each having an associated second electronic interface positioned beneath the substrate, and said resilient connector comprises four resilient connectors each extending from said planar body and orthogonally oriented relative to said planar body, said resilient connectors each electrically interconnecting one of said first electronic interfaces to said associated second electronic interfaces.

11. The electronic interface of claim 10, wherein said four first electronic interfaces are antenna dipole elements of a sheet array antenna and said second electronic interfaces are antenna feeds that are commonly fed through said aperture.

12. An electronic interconnection, comprising:
    at least one first electronic interface disposed on a substrate;
    at least one aperture formed in the substrate associated with the first electronic interface;
    a second electronic interface positioned beneath the substrate associated with the first electronic interface;
    at least one flexible appliance having a planar body positioned on said substrate, said planar body including at least one electrically conductive resilient connector extending from and orthogonally oriented relative to the planar body, said resilient connector electrically interconnecting the first electronic interface and the second electronic interface through said aperture;
    a first contact portion disposed adjacent to a first end of said resilient connector and positioned on said first electronic interface when said planar body is positioned on said substrate;
    a second contact portion disposed adjacent to a second end of said resilient connector and positioned on said second electronic interface when said planar body is positioned on said substrate; and
    an electrically conductive connection means electrically connecting said first contact portion to said first electronic interface and said second contact portion to said second electronic interface;
    wherein said aperture comprises multiple apertures formed in said substrate and said first electronic interface comprises four electronic interfaces associated with each of said apertures, each of said four first electronic interfaces having one associated second electronic interface disposed beneath said substrate, and one flexible appliance having a planar body associated with each of said apertures, each of said flexible appliances having four resilient connectors extending from and orthogonally oriented relative to the planar body electrically interconnecting said four first electronic interfaces to the associated second electronic interfaces.

13. An apparatus for interconnecting at least one first electronic interface disposed on a substrate to a second electronic interface, comprising:
a flexible appliance having a planar body formed of a material;
at least one electrically conducting resilient connector electrically interconnecting said first electronic interface to said second electronic interface disposed beneath said substrate through an aperture defined in said substrate, said resilient connector extending radially from and orthogonally oriented relative to the planar body, said second electronic interface electrically isolated from said first electronic interface and aligned with said aperture formed through said substrate;
a first contact portion disposed adjacent a first end of said resilient connector;
a second contact portion disposed adjacent a second end of said resilient connector; and
an electrically conductive connections means electrically connecting said first contact portion to said first electronic interface and said second contact portion to said second electronic interface.

14. The apparatus of claim 13, wherein said planar body is comprised of a flexible polymer film configured for providing a base for said resilient connector and configured for grasping when said flexible appliance is positioned on said substrate.

15. An apparatus for interconnecting at least one first electronic interface disposed on a substrate to a second electronic interface disposed beneath the substrate, comprising:
a flexible appliance having a planar body formed of a material;
at least one electrically conducting resilient connector for electrically interconnecting said first electronic interface to said second electronic interface through an aperture defined in said substrate, said resilient connector extending radially from and orthogonally oriented relative to the planar body;
a first contact portion disposed adjacent a first end of said resilient connector;
a second contact portion disposed adjacent a second end of said resilient connector; and
an electrically conductive connections means electrically connecting said first contact portion to said first electronic interface and said second contact portion to said second electronic interface;
wherein said first electronic interface comprises four first electronic interfaces each having an associated second electronic interface positioned beneath the substrate, and said resilient connector comprises four resilient connectors each radially extending from said planar body and orthogonally oriented relative to the planar body, said resilient connectors each electrically interconnecting one of said first electronic interfaces to said associated second electronic interfaces.

16. An apparatus for interconnecting at least one first electronic interface disposed on a substrate to a second electronic interface disposed beneath the substrate, comprising:
a flexible appliance having a planar body formed of a material;
at least one electrically conducting resilient connector for electrically interconnecting said first electronic interface to said second electronic interface through an aperture defined in said substrate, said resilient connector extending radially from and orthogonally oriented relative to the planar body;
a first contact portion disposed adjacent a first end of said resilient connector;
a second contact portion disposed adjacent a second end of said resilient connector; and
an electrically conductive connections means electrically connecting said first contact portion to said first electronic interface and said second contact portion to said second electronic interface;
wherein said aperture comprises multiple apertures formed in said substrate and said first electronic interface comprises four electronic interfaces associated with each of said apertures, each of said four first electronic interfaces having one associated second electronic interface disposed beneath said substrate, and said flexible appliance comprises multiple flexible appliances each having a planar body with one of said flexible appliances being associated with each of said apertures, each of said flexible appliances comprising four resilient connectors extending radially from and orthogonally oriented relative to the planar body configured for simultaneously interconnecting each of said four first electronic interfaces to the associated second electronic interfaces.

17. A method of interconnecting at least one first electronic interface to an associated second electronic interface, comprising the steps of:
forming at least one first electronic interface on a substrate;
forming an aperture through said substrate aligned with said first electronic interface;
positioning a second electronic interface electrically isolated from said first electronic interface beneath the substrate and aligned with said aperture for electrically interconnecting to said first electronic interface;
selecting a flexible appliance to include a planar body and at least one resilient connector extending radially from and orthogonally oriented relative to the planar body, said resilient connector including a first contact portion and a second contact portion;
positioning said flexible appliance on said substrate so that said first contact portion is positioned on said first electronic interface and said second contact portion is positioned on said second electronic interface; and
using an electrically conductive connection means to electrically connect said first contact portion to said first electronic interface and said second contact portion to said second electronic interface.

18. The method of claim 17, further comprising selecting said electrically conductive connection means to be automated means including soldering or gap welding.

19. A method of interconnecting at least one first electronic interface to an associated second electronic interface, comprising the steps of:
forming a first electronic interface on a substrate comprising four electronic interface portions for electrically interconnecting to an associated second electronic interface;
forming an aperture in said substrate associated with said first electronic interface;
positioning said second electronic interface associated with said first electronic interface beneath said substrate and accessible through said aperture for electrically interconnecting to said first electronic interface;
selecting a flexible appliance to include a planar body having four resilient connectors extending radially from and orthogonally oriented relative to said planar body, selecting each of said resilient connectors to include first and second contact portions;

positioning said flexible appliance on said substrate so that said first contact portions are positioned on said first electronic interface and said second contact portions are positioned on said second electronic interface; and using an electrically conductive connection means to electrically connect said first contact portions to said first electronic interface and said second contact portions to said second electronic interface.

20. The method of claim 19, further comprising using said electrically conductive connection means to simultaneously electrically connect said first contact portions of said four resilient connectors to said first electronic interfaces and said second contact portions of said four resilient connectors to said second electronic interfaces.

21. A method of interconnecting at least one first electronic interface to an associated second electronic interface, comprising the steps of:

forming at least one first electronic interface on a substrate;

forming an aperture in said substrate associated with said first electronic interface;

positioning a second electronic interface associated with said first electronic interface beneath the substrate and accessible through said aperture for electrically interconnecting to said first electronic interface;

forming an flexible appliance having a planar body and at least one resilient connector extending radially from and orthogonally oriented relative to the planar body, said resilient connector including a first contact portion and a second contact portion;

positioning said flexible appliance on said substrate so that said first contact portion is positioned on said first electronic interface and said second contact portion is positioned on said second electronic interface; and using an electrically conductive connection means to electrically connect said first contact portion to said first electronic interface and said second contact portion to said second electronic interface;

wherein said aperture is selected to be multiple apertures formed in said substrate and said flexible appliance is selected to be multiple flexible appliances with one each being associated with each of said apertures, and said first electronic interface is selected to be four electronic interfaces associated with each of said apertures, each of said four first electronic interfaces having said associated second electronic interface disposed beneath said substrate, and each of said flexible appliances includes a planar body each having four resilient connectors extending radially from and orthogonally oriented relative to the planar body and electrically interconnecting each of said four first electronic interfaces to the associated second electronic interfaces.

* * * * *